(12) United States Patent
Chen et al.

(10) Patent No.: US 8,264,662 B2
(45) Date of Patent: Sep. 11, 2012

(54) IN-LINE PARTICLE DETECTION FOR IMMERSION LITHOGRAPHY

(75) Inventors: Li-Jui Chen, Hsinchu (TW);
Tsai-Sheng Gau, Hsinchu (TW);
Chi-Kang Peng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 793 days.

(21) Appl. No.: 11/764,573

(22) Filed: Jun. 18, 2007

(65) Prior Publication Data
US 2008/0309892 A1    Dec. 18, 2008

(51) Int. Cl.
*G03B 27/52* (2006.01)
*G03B 27/58* (2006.01)
*G03B 27/32* (2006.01)
*G03B 27/42* (2006.01)

(52) U.S. Cl. ............. 355/30; 355/53; 355/72; 355/77

(58) Field of Classification Search .......... 355/30, 355/53, 72–75, 77; 356/237.1, 239.2, 239.7, 356/239.8, 237.2–237.5; 430/8, 30, 311; 250/492.1, 492.2, 492.22, 548; 396/429–434
See application file for complete search history.

(56) References Cited

U.S. PATENT DOCUMENTS

| | | | |
|---|---|---|---|
| 6,208,411 B1 | 3/2001 | Vaez-Iravani | |
| 6,496,257 B1 * | 12/2002 | Taniguchi et al. | 356/239.2 |
| 6,686,570 B2 | 2/2004 | Furukawa et al. | |
| 6,788,477 B2 | 9/2004 | Lin | |
| 6,952,253 B2 | 10/2005 | Lof et al. | |
| 7,002,677 B2 | 2/2006 | Bevis et al. | |
| 7,156,925 B1 | 1/2007 | Subramanian et al. | |
| 7,164,475 B2 | 1/2007 | Fairley et al. | |
| 2004/0160582 A1 * | 8/2004 | Lof et al. | 355/30 |
| 2005/0083496 A1 | 4/2005 | Dansberg et al. | |
| 2005/0175776 A1 * | 8/2005 | Streefkerk et al. | 427/256 |
| 2005/0205108 A1 | 9/2005 | Chang et al. | |
| 2005/0231694 A1 * | 10/2005 | Kolesnychenko et al. | 355/53 |
| 2006/0033892 A1 | 2/2006 | Cadee et al. | |
| 2006/0103832 A1 * | 5/2006 | Hazelton et al. | 355/72 |
| 2006/0170891 A1 * | 8/2006 | Nishinaga et al. | 355/53 |
| 2007/0026345 A1 * | 2/2007 | Subramanian et al. | 430/311 |

(Continued)

OTHER PUBLICATIONS

Ching Yu Chang et al., "Development of Cleaning Process for Immersion Lithography," Optical Microlithography XIX, edited by Donis G. Glagello, Proc. of SPIE, vol. 6154, 61544R, (2006), 11 pages.

(Continued)

*Primary Examiner* — Peter B Kim
*Assistant Examiner* — Christina Riddle
(74) *Attorney, Agent, or Firm* — Haynes and Boone, LLP (57) ABSTRACT

An immersion lithography system, comprising a lens unit configured to project a pattern from an end thereof and onto a wafer, a hood unit configured to confine an immersion fluid to a region of the wafer surrounding the end of the lens unit, a wafer stage configured to position the wafer proximate the end of the lens unit, and at least one of an image capturing apparatus and a scattering light detection apparatus, wherein the image capturing apparatus is coupled to the wafer stage and is configured to capture an image of a surface of the hood unit proximate the wafer stage, and wherein the scattering light detection apparatus is proximate the end of the lens unit and the hood unit and is configured to detect particles on a surface of the wafer stage.

16 Claims, 4 Drawing Sheets

U.S. PATENT DOCUMENTS

| | | |
|---|---|---|
| 2007/0209433 A1 | 9/2007 | Gehman et al. |
| 2008/0198347 A1* | 8/2008 | Kawasaki et al. ............... 355/30 |
| 2008/0212043 A1* | 9/2008 | Nagasaka ....................... 355/30 |
| 2009/0061331 A1* | 3/2009 | Nakano .......................... 430/30 |

OTHER PUBLICATIONS

U.S. Appl. No. 11/427,434, filed Jun. 29, 2006.

* cited by examiner

IN-LINE PARTICLE DETECTION FOR IMMERSION LITHOGRAPHY

CROSS REFERENCES

This application is related to U.S. patent application Ser. No. 11/427,434 filed on Jun. 29, 2006, entitled "A Hood for Immersion Lithography," which claims priority from U.S. Provisional Patent Application Ser. No. 60/797,443 filed on May 4, 2006, entitled "A Hood for Immersion Lithography".

BACKGROUND

As semiconductor fabrication technologies progress to smaller feature sizes such as 65 nanometers, 45 nanometers, and below, immersion lithography methods are being adopted to address the problems associated with such fabrication. During an exposure process using an immersion lithography system, however, contaminates may accumulate on the wafer table, the wafer stage and/or the surface of the immersion system hood near the wafer table. Such contaminates can cause lithography exposure defects on the processed wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
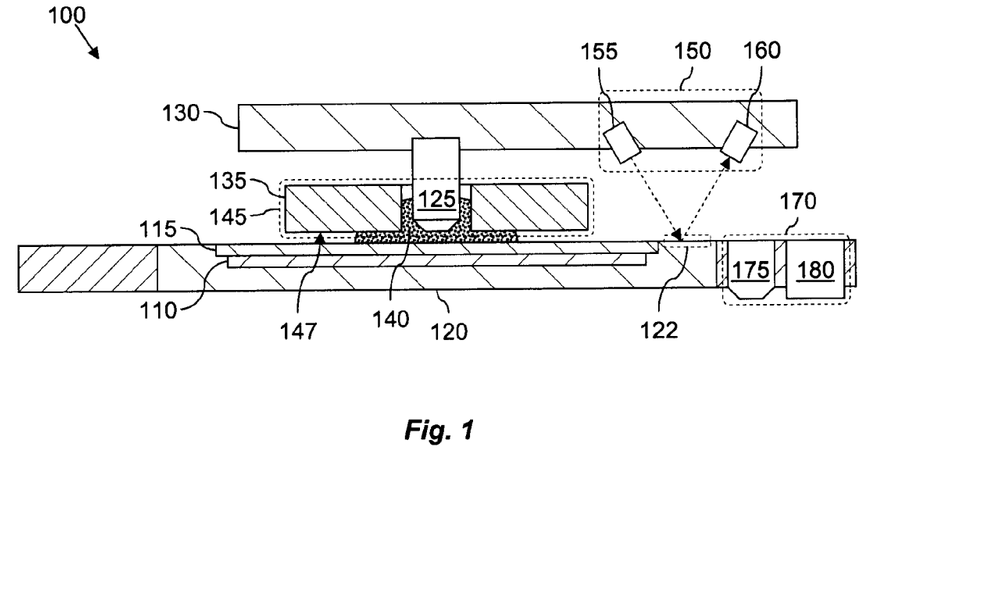
FIG. 1 is a sectional view of immersion lithography apparatus according to one or more aspects of the present disclosure.

Referring to FIG. 1, illustrated is a sectional view of an embodiment of an immersion lithography system 100 according to one or more aspects of the present disclosure. The system 100 includes a wafer table 110 configured to hold a wafer 115 to be processed by the system 100 for lithography patterning, and a wafer stage 120 configured to hold the wafer table 110. The wafer table 110 and the wafer stage 120 are collectively operable to secure and move the wafer 115 relative to the system 100. For example, the wafer table 110 and/or the wafer stage 120 may be designed to be capable of translational and/or rotational displacement for wafer alignment, stepping and scanning. The wafer table 110 and/or the wafer stage 120 may individually or collectively include various components suitable to perform precise movement.

The wafer 115 to be held by the wafer table 110 and processed by the system 100 may be a semiconductor wafer such as a silicon wafer. Alternatively, the wafer 115 may include an elementary semiconductor, a compound semiconductor, an alloy semiconductor, and/or combinations thereof. The wafer 115 may include one or more material layers such as poly-silicon, metal, and/or dielectric, to be patterned. The wafer 115 may further include an imaging layer formed thereon. The imaging layer can be a photoresist layer (resist layer) that is responsive to an exposure process for creating patterns thereon. The imaging layer may be a positive or negative type resist material and may have a multi-layer structure. One exemplary resist material is chemical amplifier (CA) resist.

The immersion lithography system 100 includes an imaging lens systems 125 (or lens system 125) positionable over the wafer table 110. A wafer 115 may be positioned on the wafer table 110 underlying the lens system 125. The lens system 125 is coupled to other structure 130 of the system 100. The other structure 130 may include or be integral to an illumination system (e.g., a condenser) which may have a single lens or multiple lenses and/or other components. For example, such an illumination system may include microlens arrays, shadow masks, and/or other structures. The lens system 125 may further include an objective lens which may have a single lens element or a plurality of lens elements. Each lens element may include a transparent substrate and may further include a plurality of coating layers. The transparent substrate may be a conventional objective lens, and may be made of fused silica ($SiO_2$), calcium-fluoride ($CaF_2$), lithium fluoride (LiF), barium fluoride ($BaF_2$), and/or other materials. The materials used for each lens element may be chosen based on the wavelength of light used in the lithography process, such as to minimize absorption and scattering.

The system 100 also includes a fluid retaining module 135 designed for providing and holding a fluid 140. The fluid retaining module 135 may substantially include an alloy such as stainless steel. The fluid 140 may include an immersion fluid such as water. The immersion fluid 140 may include water solution, de-ionized water (DIW), gas, or other proper fluid having an index of refraction higher than that of water. The immersion fluid 140 may further include an additive. The immersion fluid retaining module 135 may be positioned proximate (such as around) the lens system 125 and designed for other functions, in addition to holding the immersion fluid 140. For example, the fluid retaining module 135 may also be designed to provide a second fluid for constraining the first fluid 140. The second fluid may be air, such as dry air. The second fluid may alternatively include humidified air, hydrophobic liquid, or other suitable fluid.

The fluid retaining module 135 may include various features such as apertures and paths for providing the first and second fluids for a lithography exposure process, and/or performing other functions. Moreover, the fluid retaining module 135 and/or other component of the system 100 may also include a heating element coupled to and/or integrated with the fluid retaining module 135, wherein such heating element may be designed to provide heat to the immersion fluid 140 and/or the wafer 115 positioned on the wafer table 110, such as to compensate for heat loss from factors including evaporation effects.

The fluid retaining module 135, possibly in conjunction with the above-described structure 130, make up an immersion hood 145. The structure 130 also includes a scattering light detection system 150 that is positionally fixed relative to the immersion hood 145 via one or more other features of the structure 130. The scattering light detection system 150 includes a light source 155 and a detector 160, and are positioned via the structure 130 to detect contamination on the surface of the wafer stage 120 in a scanning region 122 thereof that is laterally adjacent or proximate the immersion hood 145. For example, as indicated by the dashed arrows in FIG. 1, the light source 155 is configured to direct light towards the scanning region 122, and the detector 160 is configured to detect the light as it scatters or reflects from the scanning region 122. Consequently, the detector 160 can be utilized to detect contaminates in the scanning region 122. For example, light from the light source 155 may scatter or reflect when it impinges on a contaminant located in the scanning region 122, such that a change in the intensity of light detected by the detector 160 can be indicative of the existence of the contaminant in the scanning region 122.

The light source 155 and/or the detector 160 may be configured to rotate about one or more axes such that the position of the scanning region 122 relative to the wafer table 110 can be adjusted. Alternatively, or additionally, the wafer table 110 and/or the wafer stage 120 may be individually or collectively configured to laterally translate relative to the scattering light detection system 150. Accordingly, via rotation of the light source 155 and/or the detector 160, translation of the structure 130 relative to the wafer stage 120, and/or translation of the wafer table 110 and/or the wafer stage 120, a substantial portion or all of the surface of the wafer table 110, the wafer stage 120 and/or the wafer 115 may be scanned with the scattering light detection system 150 to detect the existence of contaminates thereon.

The light source 155 may be configured to emit a concentrated beam of light onto a spot or relatively small region of the wafer stage 120. For example, the light source 155 may be or comprise a laser. However, other light sources are also within the scope of the present disclosure. The light source 155 may also comprise more than one light-emitting component. The detector 160 may also comprise more than one light-detecting component. In an exemplary embodiment, the light source 155 and/or detector 160 may be, comprise, or be similar to the Surfscan™ SP1 and/or Surfscan™ SP2 products available from KLA-Tencor, or components thereof.

The system 100 may additionally or alternatively include a bright image capturing system 170 configured to detect contaminates on the bottom surface 147 of the immersion hood 145. the bright image capturing system 170 comprises a light source 175 and a detector 180. In the operational mode shown in FIG. 1, the bright image capturing system 170 is not being utilized to scan the bottom surface 147 of the immersion hood 145, as the immersion hood 145 is not located vertically (relative to the page) over the bright image capturing system 170.

Figure 2:
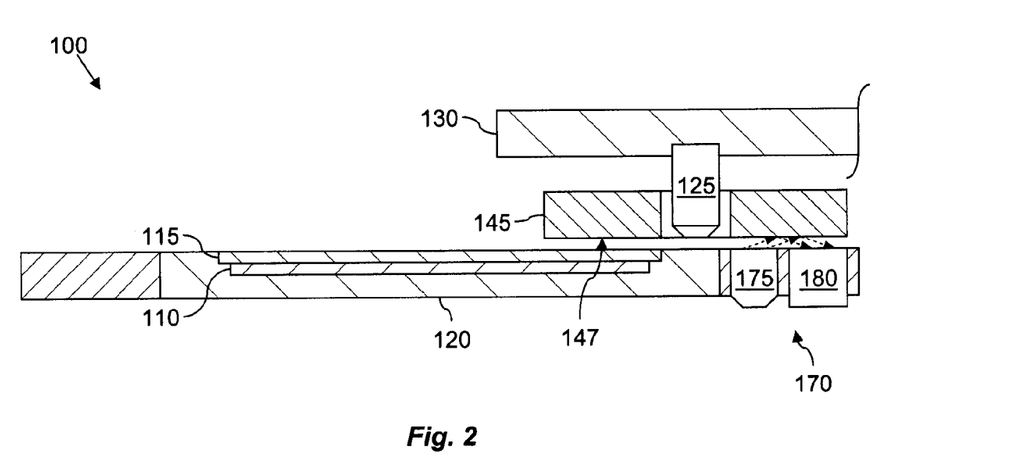
FIG. 2 is a sectional view of the apparatus shown in FIG. 1 in a different mode of operation according to one or more aspects of the present disclosure.

However, referring to FIG. 2, illustrated is a sectional view of the apparatus 100 shown in FIG. 1 in another operational mode in which the bright image capturing system 170 is employed to detect contaminates located on the surface 147 of the immersion hood 145. The light source 175 and the detector 180 are mounted within the surface of the wafer stage 120 or are otherwise coupled to the wafer stage 120, and are positioned to detect contamination on the surface 147 of the immersion hood 145. For example, as indicated by the dashed arrows in FIG. 2, the light source 175 is configured to direct light towards the immersion hood surface 147, and the detector 180 is configured to detect the light as it reflects from the surface 147. In an exemplary embodiment, the detector 180 is configured to capture a digital image of the surface 147, such that the image can subsequently be reviewed by human operator or automatically scanned to detect contaminates on the surface 147.

The light source 175 and/or the detector 180 may be mounted at any location on the wafer stage 120, except possibly for the wafer table 110. The light source 175 and/or the detector 180 may be mounted underneath a transparent surface (e.g., glass), and may have a water tight configuration. By translating the structure 130 relative to the wafer stage 120, a substantial portion or all of the bottom surface 147 of the immersion hood 140 may be scanned and imaged with the bring image capturing system 170 to detect the existence of contaminates on the surface 147.

The light source 175 may be or comprise an incandescent or fluorescent light source or a laser configured to irradiate an area of the surface 147 (for example, such area may be large in size relative to the small spot or size of the area that is illuminated by the light source 155 shown in FIG. 1). However, other light sources are also within the scope of the present disclosure. The light source 175 may also comprise more than one light-emitting component. The detector 180 may be or comprise a charged coupled device (CCD) camera configured to convert light into electrical current. However, other detectors are also within the scope of the present disclosure. The detector 160 may also comprise more than one light-detecting component. In an exemplary embodiment, the light source 175 and/or detector 180 may be, comprise, or be similar to the 2367 Series and/or 2800 Series products available from KLA-Tencor, or components thereof.

In the embodiment of the system 100 shown in FIGS. 1 and 2, the scattering light detection system 150 is configured to detect contaminates on the surface 122 of the wafer stage 120, for example, and the bright image capturing system 170 is configured to detect contaminates on the surface 147 of the immersion hood 145. However, other embodiments of the system 100 that are within the scope of the present disclosure include those in which a similar scattering light detection system 150 is configured to detect contaminates on the surface 147 of the immersion hood 145, and/or those in which a similar bright image capturing system 170 is configured to detect contaminates on the surface 122 of the wafer stage 122, for example.

Moreover, the system 100 may additionally include various sensors such as thermal sensors, position sensors, and pressure sensors configured to respectively sense temperatures, positions, and pressures including a temperature of the wafer 115 in process, a position of the wafer table 120 or wafer stage 110, a distance between the immersion hood 145 and the wafer 115, and/or a pressure of the fluid 140 (among other fluids). The wafer table 120 and/or the wafer stage 110 may additionally include various heating features integrated therein, or a mechanism to provide heated fluid thereto.

The immersion lithography system 100 may be utilized with a variety of radiation sources, such as an ultraviolet (UV) or extra UV (EUV) light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm).

A photomask (also referred to as a mask or a reticle) may be introduced into the system 100 during an immersion lithography process. The mask may include a transparent substrate and a patterned absorption layer. The transparent substrate may use fused silica ($SiO_2$), such as borosilicate glass and soda-lime glass. The transparent substrate may comprise calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN.

Figure 3:
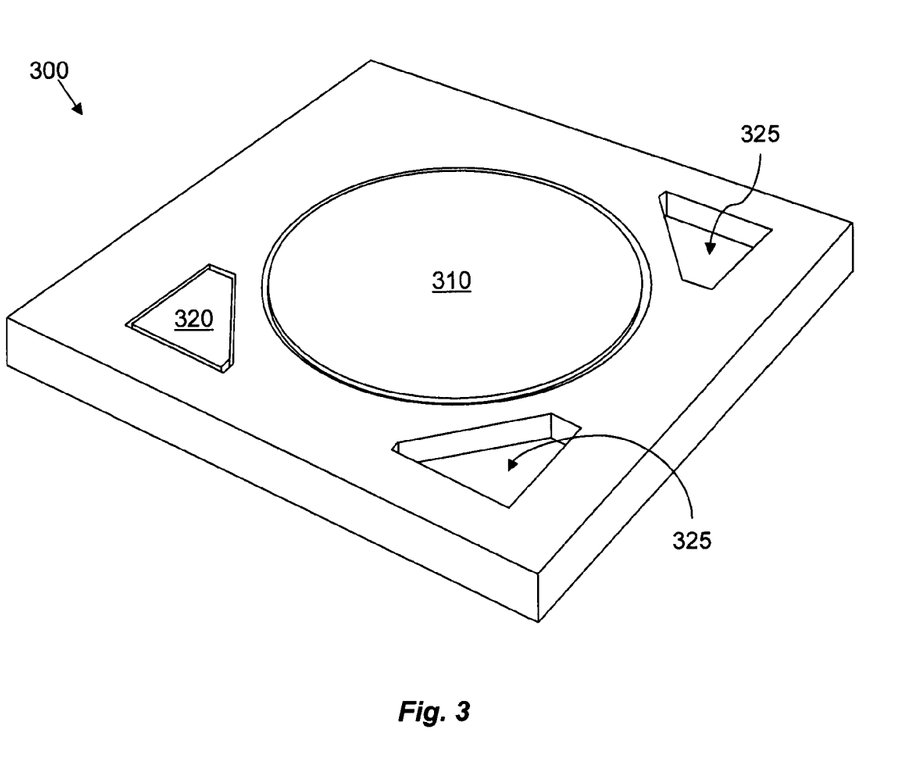
FIG. 3 is a perspective view of immersion lithography apparatus according to one or more aspects of the present disclosure.

Referring to FIG. 3, illustrated is a perspective view of an exemplary embodiment of the wafer stage 120 shown in FIGS. 1 and 2, and herein designated by reference numeral 300. The wafer stage 300 includes a wafer table 310, which may be substantially similar or identical to the wafer table 110 shown in FIGS. 1 and 2. The wafer stage 300 further includes one or more sensor plates 320. Each sensor plate 320 may comprise a bright image capturing system, such as the system 170 shown in FIGS. 1 and 2. Each sensor plate 320 may alternatively or additionally comprise a light scattering detection system, such as the system 150 shown in FIGS. 1 and 2. As shown in FIG. 3, each sensor plate 320 may be located radially outward from the wafer table 110, possible near corner sections 325 of the wafer stage 300. The sensor plates 320 may each be integrally formed with the wafer stage 300, or, as shown in FIG. 3, may be discrete components that are coupled or otherwise assembled within recesses or openings 325 of the wafer stage 300.

Figure 4:
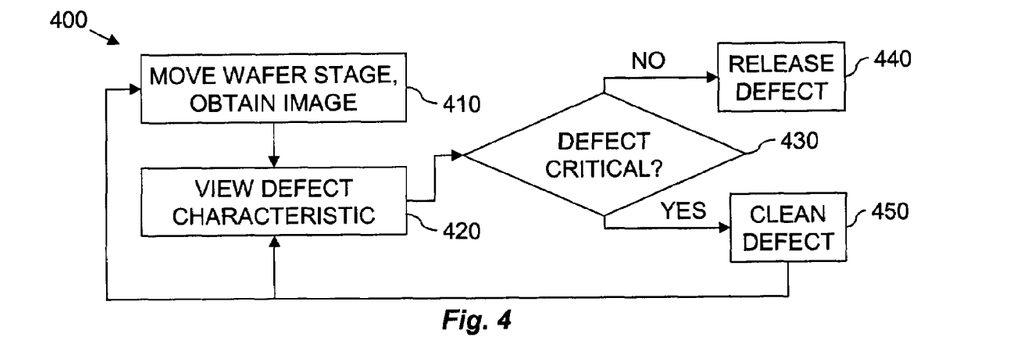
FIG. 4 is a flow-chart diagram of a method according to one or more aspects of the present disclosure.

Referring to FIG. 4, illustrated is a flow-chart diagram of an exemplary method 400 for utilizing an immersion lithography apparatus, such as the immersion lithography system 100 shown in FIGS. 1 and 2, for performing in-line immersion hood cleanliness inspection. The method 400 begins at step 410 by moving the wafer stage and obtaining an image of the bottom surface of the immersion hood. In step 420, a defect identified in the image obtained during step 410 is viewed or otherwise analyzed. Such analysis may be performed by an engineer, operator or other human, although such analysis may alternatively or additionally be at least partially performed or confirmed automatically via one or more computing devices. If the shape or other characteristic of such defect is not indicative of the defect being a critical defect, as determined during decisional step 430, the defect is released in a subsequent step 440. Otherwise, if the defect is determined to be critical, the defect is cleaned or otherwise processed so that the defect does not deleteriously affect subsequent immersion lithography processing. All or a portion of the process 400 is then repeated, beginning at step 410 or step 420.

Figure 5A:
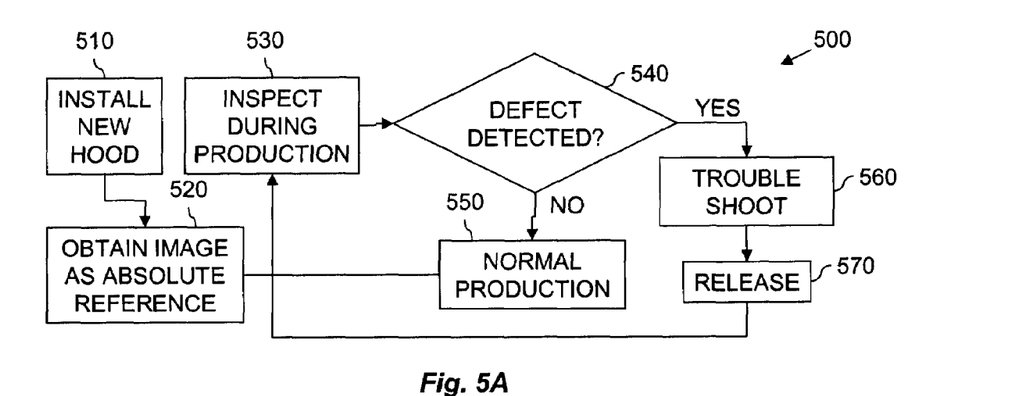
FIGS. 5A and 5B are flow-chart diagrams of methods each according to one or more aspects of the present disclosure.

Referring to FIG. 5A, illustrated is a flow-chart diagram of an exemplary method 500 for utilizing an immersion lithography apparatus, such as the immersion lithography system 100 shown in FIGS. 1 and 2, for performing automatic detection and cleaning of a new, unused immersion hood. The method 500 begins at step 510 by installing a new and unused immersion hood, such as the immersion hood 145 shown in FIGS. 1 and 2. In a subsequent step 520, an image of the bottom surface of the immersion hood is obtained, such as via the detector 180 shown in FIGS. 1 and 2. This image will be employed as an absolute reference to which subsequently obtained images will be compared. In a subsequent step 530, an additional image of the immersion hood is obtained during production processing. Such image capturing may be performed automatically by an image capturing system such as the bright image capturing system 170 shown in FIGS. 1 and 2. In a subsequent decisional step 540, the additional image captured in step 530 is compared to the absolute reference image obtained during step 520 to determine if any defects are detected. If no defects are detected, production continues in a normal fashion in a subsequent step 550, and the processing resumes with the parallel production and inspection of step 530.

However, if one or more defects are detected by comparing the image captured in step 530 to the reference image captured in step 520, as determined during decisional step 540, troubleshooting is performed in a subsequent step 560. Such troubleshooting may comprise analysis of the detected defect by an engineer, operator or other human, although such analysis may alternatively or additionally be at least partially performed or confirmed automatically via one or more computing devices. Such troubleshooting may additionally comprise correcting the defect (e.g., cleaning the immersion hood), root-cause analysis and/or other analysis to prevent the defect from occurring again, scrapping effected product, and/or other aspects. After such troubleshooting is performed in step 560, the defect is released in a subsequent step 570, and production continues in a normal fashion such that processing resumes with the parallel production and inspection of step 530.

Figure 5B:
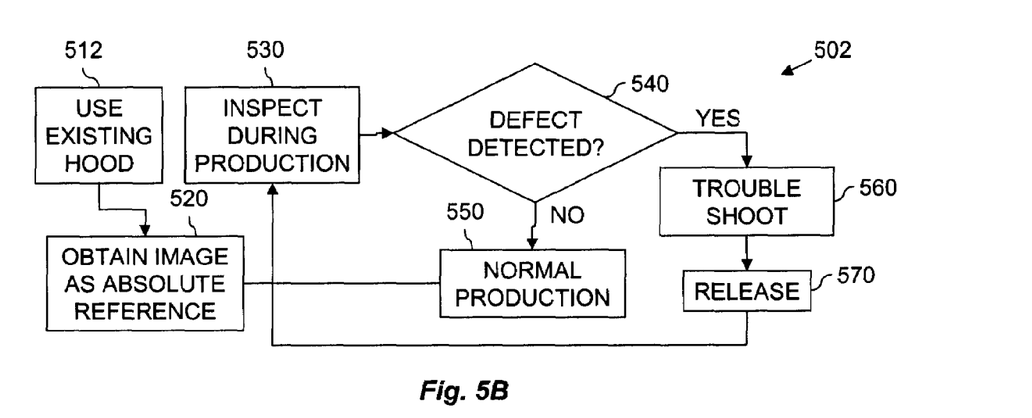

Referring to FIG. 5B, illustrated is a flow-chart diagram of an exemplary method 502 for utilizing an immersion lithography apparatus, such as the immersion lithography system 100 shown in FIGS. 1 and 2, for performing automatic detection and cleaning of an existing, used immersion hood. The method 502 begins at step 512 by using an existing immersion hood, such as the immersion hood 145 shown in FIGS. 1 and 2. In a subsequent step 520, an image of the bottom surface of the immersion hood is obtained, such as via the detector 180 shown in FIGS. 1 and 2. This image will be employed as an absolute reference to which subsequently obtained images will be compared. In a subsequent step 530, an additional image of the immersion hood is obtained during production processing. Image capturing may be performed automatically by an image capturing system such as the bright image capturing system 170 shown in FIGS. 1 and 2. In a subsequent decisional step 540, the additional image captured in step 530 is compared to the absolute reference image obtained during step 520 to determine if any defects are detected. If no defects are detected, production continues in a normal fashion in a subsequent step 550, and the processing resumes with the parallel production and inspection of step 530.

However, if one or more defects are detected by comparing the image captured in step 530 to the reference image captured in step 520, as determined during decisional step 540, troubleshooting is performed in a subsequent step 560. Such troubleshooting may comprise analysis of the detected defect by an engineer, operator or other human, although such analysis may alternatively or additionally be at least partially performed or confirmed automatically via one or more computing devices. Such troubleshooting may additionally comprise correcting the defect (e.g., cleaning the immersion hood), root-cause analysis and/or other analysis to prevent the defect from occurring again, scrapping effected product, and/or other aspects. After such troubleshooting is performed in step 560, the defect is released in a subsequent step 570, and production continues in a normal fashion such that processing resumes with the parallel production and inspection of step 530.

Figure 6:
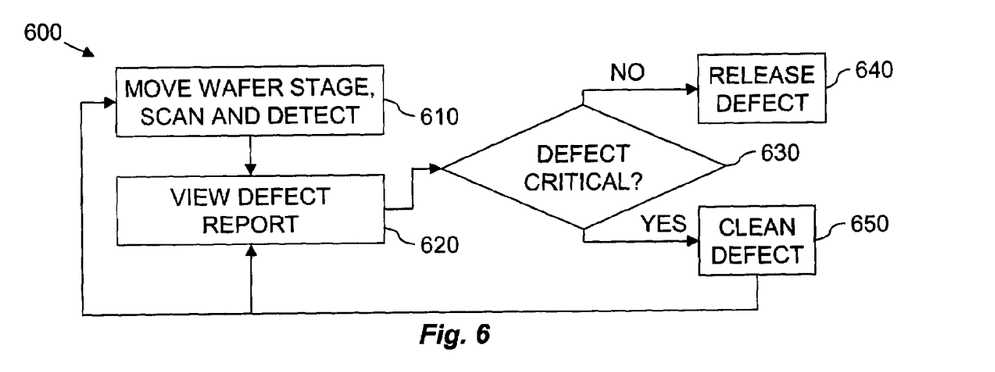
FIG. 6 is a flow-chart diagram of a method according to one or more aspects of the present disclosure.

Referring to FIG. 6, illustrated is a flow-chart diagram of an exemplary method 600 for utilizing an immersion lithography apparatus, such as the immersion lithography system 100 shown in FIGS. 1 and 2, for performing in-line wafer stage cleanliness inspection. The method 600 begins at step 610 by moving the wafer stage and scanning the top surface of the wafer stage to detect contaminants thereon. In step 620, a defect report is reviewed and any defect identified in the scanning and detection performed during step 610 is viewed or otherwise analyzed. Such analysis may be performed by an engineer, operator or other human, although such analysis may alternatively or additionally be at least partially performed or confirmed automatically via one or more computing devices. If the shape or other characteristic of such defect is not indicative of the defect being a critical defect, as determined during decisional step 630, the defect is released in a subsequent step 640. Otherwise, if the defect is determined to be critical, the defect is cleaned or otherwise processed so that the defect does not deleteriously affect subsequent immersion lithography processing. All or a portion of the process 600 is then repeated, beginning at step 610 or step 620.

Figure 7A:
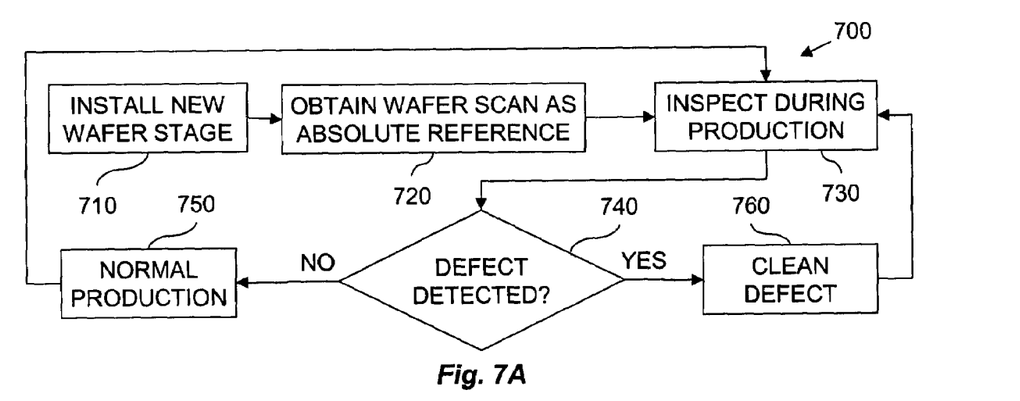
FIGS. 7A and 7B are flow-chart diagrams of methods each according to one or more aspects of the present disclosure.

Referring to FIG. 7A, illustrated is a flow-chart diagram of an exemplary method 700 for utilizing an immersion lithography apparatus, such as the immersion lithography system 100 shown in FIGS. 1 and 2, for performing automatic detection and cleaning of a new, unused wafer stage. The method 700 begins at step 710 by installing a new and unused wafer stage, such as the wafer stage 120 shown in FIGS. 1 and 2. In a subsequent step 720, a scan of the top surface of the wafer stage is obtained, such as via the detector 160 shown in FIGS. 1 and 2. This scan will be employed as an absolute reference to which subsequently obtained scans will be compared. In a subsequent step 730, an additional scan of the immersion hood is obtained during production processing. Such scanning may be performed automatically by an scanning system such as the light scattering detection system 150 shown in FIGS. 1 and 2. In a subsequent decisional step 740, the additional scan performed in step 730 is compared to the absolute reference scan obtained during step 720 to determine if any defects are detected. If no defects are detected, production continues in a normal fashion in a subsequent step 750, and the processing resumes with the parallel production and inspection of step 730.

However, if one or more defects are detected by comparing the scan obtained in step 730 to the reference scan obtained in step 720, as determined during decisional step 740, the defect is cleaned in a subsequent step 760. Thereafter, production continues in a normal fashion such that processing resumes with the parallel production and inspection of step 730.

Figure 7B:
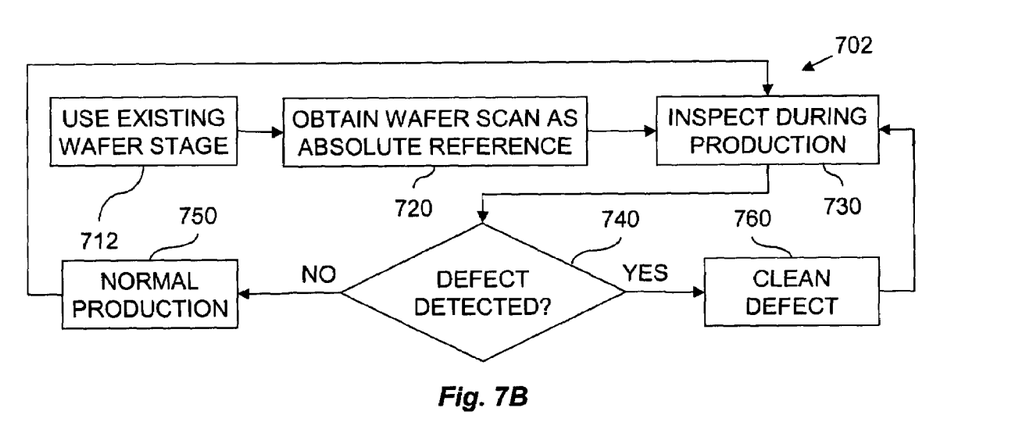

Referring to FIG. 7B, illustrated is a flow-chart diagram of an exemplary method 702 for utilizing an immersion lithography apparatus, such as the immersion lithography system 100 shown in FIGS. 1 and 2, for performing automatic detection and cleaning of an existing, used wafer stage. The method 702 begins at step 712 by using an existing, used wafer stage, such as the wafer stage 120 shown in FIGS. 1 and 2. In a subsequent step 720, a scan of the top surface of the wafer stage is obtained, such as via the detector 160 shown in FIGS. 1 and 2. This scan will be employed as an absolute reference to which subsequently obtained scans will be compared. In a subsequent step 730, an additional scan of the immersion hood is obtained during production processing. Such scanning may be performed automatically by an scanning system such as the light scattering detection system 150 shown in FIGS. 1 and 2. In a subsequent decisional step 740, the additional scan performed in step 730 is compared to the absolute reference scan obtained during step 720 to determine if any defects are detected. If no defects are detected, production continues in a normal fashion in a subsequent step 750, and the processing resumes with the parallel production and inspection of step 730.

However, if one or more defects are detected by comparing the scan obtained in step 730 to the reference scan obtained in step 720, as determined during decisional step 740, the defect is cleaned in a subsequent step 760. Thereafter, production continues in a normal fashion such that processing resumes with the parallel production and inspection of step 730.

In each of the methods described above, shown in FIG. 4, 5A, 5B, 6, 7A or 7B, or otherwise within the scope of the present disclosure, a mask having a predefined pattern may be provided and positioned properly in the immersion lithography apparatus. A substrate or wafer to be processed is also provided and positioned on the wafer table of the lithography apparatus. The substrate may be a semiconductor wafer coated with an imaging layer such as a photoresist layer. The method may include flowing an immersion fluid such as water into a space between an imaging lens module and the wafer on the wafer table. A second fluid such as air may also be provided in support to restrain the immersion fluid in a space between the lens system and the wafer. The method may also include heating the immersion fluid and the wafer on the wafer table, such as through controlling a heating element, including through dynamic control to provide thermal compensation uniformly or non-uniformly. An exposure process may also be performed to expose the wafer through the immersion fluid, such as where a radiation energy such as an ultraviolet (UV) light may be projected through the immersion fluid and onto the wafer. The wafer may be exposed in various modes, such as a step-and-scan mode. Each field of the wafer may be stepped under the projected UV radiation and scanned by the UV radiation. During the exposure process, the thermal compensation from a heating element and/or fluids may be continued. Other processing steps may be additionally or alternatively performed before, between, and/or after the above-described steps. For example, baking the photoresist layer and developing thereof may be performed after the exposure process.

In view of all of the above, it should be apparent to those skilled in the pertinent art that the present disclosure introduces an immersion lithography system comprising, at least in one embodiment, a lens unit configured to project a pattern from an end thereof and onto a wafer, a hood unit configured to confine an immersion fluid to a region of the wafer surrounding the end of the lens unit, a wafer stage configured to position the wafer proximate the end of the lens unit, and an image capturing apparatus coupled to the wafer stage and configured to capture an image of a surface of the hood unit proximate the wafer stage. The image capturing apparatus may comprise a light source and CCD camera. The light source may be configured to illuminate the surface of the hood unit and the CCD camera may be configured to detect illumination reflected from the surface of the hood to thereby detect image defects associated with the surface of the hood unit. The light source and CCD camera may be embedded in a sensor plate module coupled to the wafer stage. The sensor plate module may be watertight.

The present disclosure also provides an immersion lithography system comprising a lens unit configured to project a pattern from an end thereof and onto a wafer, a hood unit configured to confine an immersion fluid to a region of the wafer surrounding the end of the lens unit, a wafer stage configured to position the wafer proximate the end of the lens unit, and a scattering light detection apparatus proximate the end of the lens unit and the hood unit and configured to detect particles on a surface of the wafer stage. The system may further comprise a structure configured to positionally fix the scattering light detection apparatus relative to the lens unit. The image capturing apparatus may comprise a light source and a detector. The light source may be configured to project light energy onto the surface of the wafer stage and the detector may be configured to detect scattering of the light energy caused by a particle on the surface of the wafer stage.

A method for immersion lithography is also introduced in the present disclosure. At least in one embodiment, the method comprises positioning a wafer proximate the end of a lens unit using a wafer stage, projecting a pattern onto the wafer using the lens unit while confining an immersion fluid to a region of the wafer surrounding an end of the lens unit using a hood unit, and capturing an image of a surface of the hood unit proximate the wafer stage using an image capturing apparatus coupled to the wafer stage. The method may further comprise cleaning the surface of the hood unit based on analysis of the captured image. The image capturing apparatus may be configured for automatic in-line detection of particles on the surface of the hood unit. The image capturing apparatus may be further configured to automatically trigger cleaning of the surface of the hood unit in response detection of particles on the surface of the hood unit. The method may further comprise capturing a baseline image of the surface of the hood unit before positioning the wafer stage proximate the end of the lens unit and projecting the pattern onto the wafer.

Another embodiment of a method for immersion lithography provided by the present disclosure comprises positioning a wafer proximate the end of a lens unit using a wafer stage, projecting a pattern onto the wafer using the lens unit while confining an immersion fluid to a region of the wafer surrounding an end of the lens unit using a hood unit, and detecting a particle on the wafer stage using a scattering light detection apparatus proximate the lens unit and the hood unit. The method may further comprise cleaning the wafer stage to remove the particle. Detecting the particle may comprise automatic in-line detection of the particle on the wafer stage, and cleaning the wafer stage may be triggered by the automatic in-line detection of the particle.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An immersion lithography system, comprising:
    a lens unit configured to project a pattern from an end thereof and onto a wafer;
    a hood unit configured to confine an immersion fluid to a region of the wafer surrounding the end of the lens unit;
    a wafer stage configured to position the wafer proximate the end of the lens unit; and
    an image capturing apparatus coupled to the wafer stage and configured to capture an image of a surface of the hood unit proximate the wafer stage during projection of the pattern onto the wafer.

2. The system of claim 1 wherein the image capturing apparatus comprises a light source and a CCD camera.

3. The system of claim 2 wherein the light source is configured to illuminate the surface of the hood unit and the CCD camera is configured to detect illumination reflected from the surface of the hood to thereby detect image defects associated with the surface of the hood unit.

4. The system of claim 2 wherein the light source and CCD camera are embedded in a sensor plate module coupled to the wafer stage.

5. The system of claim 4 wherein the sensor plate module is watertight.

6. A method for immersion lithography, comprising:
    positioning a wafer proximate the end of a lens unit using a wafer stage;
    projecting a pattern onto the wafer using the lens unit while confining an immersion fluid to a region of the wafer surrounding an end of the lens unit using a hood unit; and
    capturing an image of a surface of the hood unit proximate the wafer stage during projection of the pattern onto the wafer using an image capturing apparatus coupled to the wafer stage.

7. The method of claim 6 further comprising cleaning the surface of the hood unit based on analysis of the captured image.

8. The method of claim 7 wherein the image capturing apparatus is configured for automatic in-line detection of particles on the surface of the hood unit.

9. The method of claim 8 wherein the image capturing apparatus is further configured to automatically trigger cleaning of the surface of the hood unit in response to detection of particles on the surface of the hood unit.

10. The method of claim 6 further comprising capturing a baseline image of the surface of the hood unit before positioning the wafer stage proximate the end of the lens unit and projecting the pattern onto the wafer.

11. An immersion lithography system, comprising:
    a lens unit configured to project a pattern from an end thereof and onto a wafer;
    a hood unit configured to confine an immersion fluid to a region of the wafer surrounding the end of the lens unit;
    a wafer stage configured to position the wafer proximate the end of the lens unit, the wafer stage comprising an integrated image capturing apparatus configured to capture an image of a surface of the hood unit proximate the wafer stage during projection of the pattern onto the wafer.

12. The system of claim 11 wherein the image capturing apparatus comprises a light source and a CCD camera.

13. The system of claim 12 wherein the light source is configured to illuminate the surface of the hood unit and the CCD camera is configured to detect illumination reflected from the surface of the hood to thereby detect image defects associated with the surface of the hood unit.

14. The system of claim 12 wherein the light source and CCD camera are embedded in a sensor plate module integrated with the wafer stage.

15. The system of claim 14 wherein the sensor plate module is watertight.

16. The system of claim 14 wherein the integrated image capturing apparatus is embedded within the wafer stage during projection of the pattern onto the wafer.

* * * * *